(12) United States Patent
Bahm (10) Patent No.: US 11,450,508 B2
(45) Date of Patent: Sep. 20, 2022

(54) COMPARATIVE HOLOGRAPHIC IMAGING

(71) Applicant: FEI Company, Hillsboro, OR (US)

(72) Inventor: Alan Bahm, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 352 days.

(21) Appl. No.: 16/717,748

(22) Filed: Dec. 17, 2019

(65) Prior Publication Data

US 2021/0183610 A1 Jun. 17, 2021

(51) Int. Cl.
*H01J 37/22* (2006.01)
*G03H 1/08* (2006.01)
*H01J 37/26* (2006.01)
*G03H 1/00* (2006.01)

(52) U.S. Cl.
CPC ......... *H01J 37/222* (2013.01); *G03H 1/0866* (2013.01); *H01J 37/265* (2013.01); *G03H 2001/005* (2013.01); *G03H 2001/0072* (2013.01)

(58) Field of Classification Search
CPC .. H01J 37/00; H01J 37/02; H01J 37/26; H01J 37/28; H01J 37/222; H01J 37/265; H01J 2237/20; H01J 2237/2614; G03H 1/0866; G03H 1/0443; G03H 1/26; G03H 2001/005; G03H 2001/0072; G03H 2001/0047; G03H 2001/266; G03H 2001/0038; G03H 2001/2655; G03H 2240/51; G03H 2240/52; G03H 5/00
USPC ................. 250/306, 307, 310, 311
See application file for complete search history.

(56) References Cited

U.S. PATENT DOCUMENTS

| | | | | |
|---|---|---|---|---|
| 5,095,207 A | * | 3/1992 | Tong | G03H 5/00 250/307 |
| 7,227,630 B1 | * | 6/2007 | Zavislan | G02B 21/0028 356/244 |
| 2004/0094712 A1 | * | 5/2004 | Kaji | H01J 37/28 250/307 |
| 2008/0111069 A1 | * | 5/2008 | Notte | H01J 37/08 250/282 |
| 2017/0146787 A1 | * | 5/2017 | Reed | G01N 23/225 |
| 2019/0311880 A1 | * | 10/2019 | Tiemeijer | H01J 37/243 |

OTHER PUBLICATIONS

EP20213668.5, Extended European Search Report, dated May 19, 2021, 9 pages.
Lichte et al: "Electron holography-basics and applications", Reports on Progress In Physics, Institute of Physics Publishing, vol. 71, No. 1, Jan. 1, 2008 (Jan. 1, 2008), p. 16102, XP020127398, ISSN: 0034-4885.
Terminello et al., "Holographic Imaging of Atoms Using Multiple-Wave-Number Electron Angular Distribution Patterns", Physical Review Letters, American Physical Society, vol. 70, No. 5, Feb. 1, 1993 (Feb. 1, 1993), pp. 599-602, XP000345739, DOI:10.1103/PHYSREVLETT.70.599.

* cited by examiner

*Primary Examiner* — Jason L McCormack (57) ABSTRACT

Apparatuses and methods for comparative holographic imaging to improve structural and molecular information of reconstructions is disclosed herein. An example method at least includes acquiring a plurality of holograms of a sample, wherein each hologram of the plurality of holograms is acquired at a different electron beam energy, and determining atomic and structural information of the sample based at least on a comparison of at least two of the holograms of the plurality of holograms.

18 Claims, 5 Drawing Sheets

COMPARATIVE HOLOGRAPHIC IMAGING

FIELD OF THE INVENTION

The invention relates generally to holography, and specifically to enhanced holographic-based analytics.

BACKGROUND OF THE INVENTION

Known holographic techniques have been used to image and study materials for some time. However, while advances in imaging hardware have improved, the quality and quantity of information obtainable from holograms have not similarly advanced. In biological fields, the study of soft materials, such as proteins, is of utmost importance, but the nature of the soft materials limits the analytical techniques. While holography provides a less damaging analytical and imaging technique, the limited information available from the resulting holograms and/or reconstructions limit the usefulness of holography. As such, it is desirable to improve the information available from holography, especially low energy holography, at least in the field of biological investigation.

SUMMARY

Apparatuses and methods for comparative holographic imaging to improve structural and molecular information of reconstructions is disclosed herein. An example method at least includes acquiring a plurality of holograms of a sample, wherein each hologram of the plurality of holograms is acquired at a different electron beam energy, and determining atomic and structural information of the sample based at least on a comparison of at least two of the holograms of the plurality of holograms.

An example apparatus at least incudes an emitter coupled to emit an electron beam toward a sample, a detector coupled to receive the electron beam after interacting with the sample, and a controller coupled to the emitter and detector. The controller includes code that, when executed, causes the controller to acquire, with an electron beam, a plurality of holograms of a sample, wherein each hologram of the plurality of holograms is acquired at a different electron beam energy, and determine atomic and structural information of the sample based at least on a comparison of at least two of the holograms of the plurality of holograms.

BRIEF DESCRIPTION OF THE DRAWINGS

Like reference numerals refer to corresponding parts throughout the several views of the drawings.

DETAILED DESCRIPTION OF EMBODIMENTS

Embodiments of the present invention are described below in the context of an electron holography system. In particular, the embodiments are directed toward an electron holography system capable of acquiring multiple holograms of a sample to determine molecular and/or structural information of the sample based on a comparison of at least two of the holograms. In such embodiments, each hologram is acquired at a different illumination energy. Because elastic and inelastic scattering is energy dependent, the holograms at different illumination energies provide different holographic information, which, when compared, provides more detailed structural and molecular information of the sample.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections.

Direct electron imaging, which uses a beam of electrons, can be used to acquire holograms of samples. The electrons in the beam form a reference wave and a scattered wave from an object of interest (e.g., a protein) that interfere. The interference pattern can then be captured on a detector farther down the optical axis. This arrangement is also known as inline holography. Known digital holography techniques can be used to numerically reconstruct the exit wave from the detected hologram, yielding a kind of "silhouette" of the object. The elastic and inelastic scattering cross-sections for atoms all show an energy dependence, which may be leveraged to obtain additional insight into the sample being imaged. However, a single hologram may not provide the desired additional insight.

By capturing holograms at two or more wavelengths (e.g., energies), it is possible that information could be inferred about the object by comparison between holograms and/or their reconstructions; more information than is available from just the individual holograms/reconstructions. For example, higher resolution may be available by applying a type of deconvolution, and/or atomic differences might be detectable. At some energies, the object will be more opaque to the coherent electron beam, because of the energy-dependent scattering cross-sections. As a result, different depths of the object will be probed by the different energies, where the "depth" is in the same direction as the optical axis. Known deconvolution techniques applied to differences in holograms or reconstructions should reveal z-depth information of the atoms forming a sample. Additionally, the elastic scattering cross-sections of the atoms are energy dependent, and some differences are known to exist between species (e.g. H and C), which may allow identifying individual atoms that form the sample. By comparison in the reconstructed intensities of the holograms, it is possible that material differences can be observed.

Figure 1:
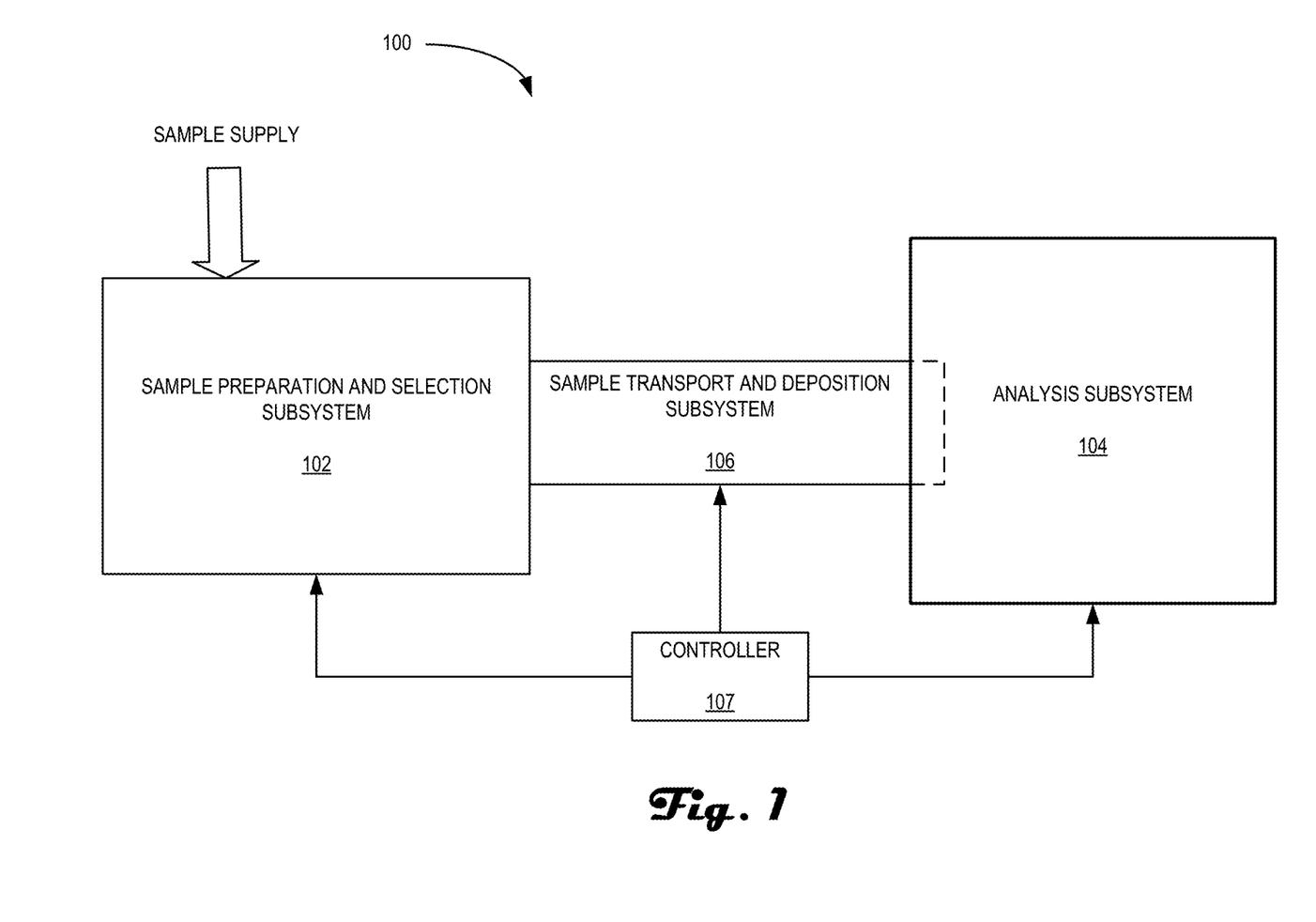
FIG. 1 is an example sample preparation and analysis system in accordance with an embodiment of the present disclosure.

FIG. 1 is an example sample preparation and analysis system 100 in accordance with an embodiment of the present disclosure. System 100 is capable of preparing various samples for subsequent analysis, which includes holographic analytical techniques. While at least the analysis aspects may be used on any desired sample types, the sample preparation and delivery aspects may be more applicable to soft sample types that tend to be delicate, e.g., biological materials. In some embodiments, the sample is a protein or biomolecule desired to be analyzed in a native-like state. In such an embodiment, the system 100 ionizes the protein, filters the desired protein from an ionized sample supply, transports the ionized protein to the analysis area where the protein is deposited on a substrate for analysis. The deposition may be performed to reduce or eliminate any damage to the sample material. While the discussion uses biological materials as an example sample, other sample types are also within the scope of the present disclosure.

The system 100 may at least include a sample preparation and selection subsystem 102, a sample transport and deposition subsystem 106, an analysis subsystem 104, and a controller 107. While not shown, various vacuum pumps and power supplies may be coupled to at least some of the subsystems and components to provide a desired operating environment. In some embodiments, the three subsystems 102, 104 and 106 may form a monolithic sample preparation and analysis system for imaging a sample, where the monolithic system includes a continuous path from sample introduction to imaging/analysis. In other embodiments, however, the subsystems 102 and 106 may form a monolithic system for preparation and deliver of a sample to a substrate, which may then be delivered to an analytical tool of choice by any desirable means, such as a freestanding holographic system. Regardless of the embodiment, the holographic techniques discussed herein may be implemented to gain more detailed sample information over general holographic analysis.

Subsystem 102 performs various functions on an input sample supply to provide desired samples. In some embodiments, the sample is a protein, such as lysozyme, calmodulin, protein A/G, OmpF porin (an outer membrane protein of *Escherichia coli* (1)), monoclonal antibody immunoglobulin (IgG), C-reactive protein (CRP), streptavidin, and human serum albumin, to name a few. Of course, the prior list of proteins is included for examples and is not limiting to the disclosure. The various functions provided by subsystem 102 at least include ionization of the input sample supply, and filtering or selection of a target sample type from the sample supply. An example subsystem 102 may be a Thermo Scientific™ Q Exactive™ Mass Spectrometer. In some embodiments, the filtered, ionized sample may be kinetically cooled to reduce overall kinetic energy of the sample. After cooling, the sample is provided to subsystem 106. In embodiments where the sample is a protein, it may be desirable that the protein be in a desired native-like state after preparation and filtering, which may be validated in some embodiments. Of course, in other embodiments, the protein need not be in a desired native-like state and nor does the sample need to be a protein. The discussion of the sample being formed of proteins is only for system illustration purposes and is not intended to be limiting in any way.

Subsystem 104 may comprise a direct imaging system, such as an in-line or reflective holographic imaging system, which includes at least an emitter and a detector. The direct imaging system may include a charged particle beam emitter, e.g., electron emitter, or a light emitter, e.g., a laser. Regardless of emitter type, subsystem 104 is able to adjust the emitted energy so that a resulting illumination beam includes charged particles or photons of a desired energy/wavelength/frequency. The detector may be a pixel-based, solid state detector or a micro-channel phase plate detector, but any detector compatible with the emitter is contemplated herein. In some embodiments, the sample may be placed between the emitter and the detector for in-line holography. In other embodiments, the emitter, sample and detector may be arranged for reflective holography. Of course, other arrangements are also contemplated herein and are within the scope of the present disclosure.

In some embodiments, subsystem 104 is a direct electron imaging system that generates electron interference images of a sample. In such an embodiment, the electron interference images, e.g., holograms, may be used to form reconstructed images of the sample. Subsystem 104 generates holograms using illumination of different energy so that multiple holograms of a sample may be acquired, each at a different energy. Due to the nature of illumination energy interaction with the sample, each hologram may provide different quality of information about the sample. As a result, once there are two or more holograms acquired of the sample, the holograms (or reconstructed images based thereon) may be compared to obtain more detailed information of the sample, such as structural and/or atomic information of the sample that may not be available based on a single hologram. The structural information may be depth of atoms and complexes that form the sample, the depth being in the direction of illumination, where the atomic information may include identification of atoms forming the sample and/or bonding energies. In general, subsystem 104 is not limited by the other subsystems, and subsystems 102 and 106 can be used to select and deposit samples for any end analysis technique.

Subsystem 106 provides sample transportation and deposition processes for prepared samples provided by subsystem 102. In some embodiments the sample may be ionized by subsystem 102, and in such embodiments subsystem 106 may include a plurality ion transport stages coupled together that terminate at a deposition location. The termination of the transport stages may include ion optics configured to slow the travel of the sample ions down so that they can be deposited on a substrate without damage, or at least with minimal damage. For example, in some embodiments, it may be desirable to deposit a protein at an energy that reduces or prevents the proteins from being denatured for subsequent analysis. Preferably, ion energy does not exceed 30 eV/charge or more preferably 10 eV/charge at deposition.

Additionally or alternatively, some embodiments of system 100 may not have subsystem 102 coupled to subsystem 104 via subsystem 106. In such embodiments, the sample may be transported by a user from subsystem 106 to subsystem 104, by hand for example. For example, an ionized protein sample is deposited onto a substrate that is then removed from subsystem 106 before inserted into subsystem 104. In some embodiments, the substrate of subsystem 106 is located in an analytical position. In such an embodiment, the sample is deposited onto the substrate and is ready for analysis in that location. In other embodiments, however, the substrate is translated from a deposition position to an analytical position.

Controller 107 is coupled to the other subsystems of system 100 to control and/or initiate their individual and choreographed operation. The controller 107 may be one or more processing cores or microcontrollers and associated memory and storage for storing executable code. In addition to controlling the operation of system 100, controller 107 may also process data generated by analysis subsystem 104. Of course, the processing of this data may alternatively or additionally be performed by off-line computers. The processing of the data may include generating reconstructed images from one or more holograms acquired by subsystem 104, and/or the comparison of two or more holograms or reconstructions of a sample to determine structural and/or atomic information of the sample. The structural information may be depth and/or location information of components, e.g., atoms and molecules, that form the sample, and the atomic information may include identification of individual atoms and/or bonding information of the components forming the sample. The comparison may include various mathematical operations, such as deconvolutions, convolutions, additions, subtractions, divisions, multiplications, averages and combinations thereof. In general, obtaining holograms of different energies and then comparing those holograms may provide more detailed information of the sample than a single hologram may provide.

In operation, a sample supply is provided to subsystem 102. The sample supply, which may be in solid or liquid form, includes a target protein along with other carrier substances and/or impurities, for example. Subsystem 102 may initially ionize the sample supply to prepare for filtering, such as by electro-spray ionization. Filtering may then be performed to extract the target protein from the sample supply. For example, the target protein may be filtered using mass to charge ratio techniques, such as by a mass spectrometer. Once the ionized protein has been prepared, the ionized protein is kinetically cooled then transported to a substrate via subsystem 106. To ensure the ionized protein is kept in its native-like state, for example, soft-landing techniques are employed to deposit the ionized protein onto the substrate. After deposition, one or more holograms of the sample may be formed by subsystem 104. For example, a plurality of holograms of the sample may be formed with each hologram formed using a different illumination energy. Once at least two holograms are obtained, the controller 107 may compare the holograms to obtain more detailed structural and/or atomic information about the sample, such as depth and atomic identity of the components forming the sample. Acquiring multiple holograms with each one at a different energy and then comparing the holograms provides more detailed information of the sample than a single hologram can offer. As noted, the energy dependence on elastic and inelastic scattering for atoms allows for differences between holograms of different energy to provide insight into the internal structure and makeup of the sample.

Figure 2:
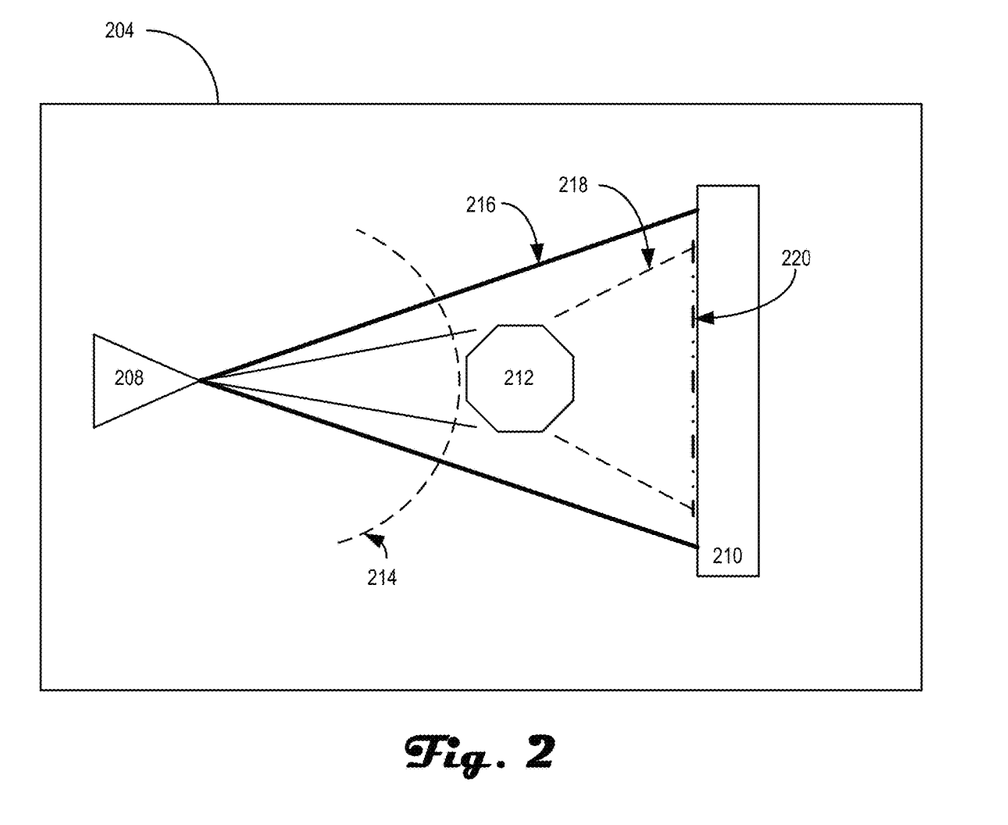
FIG. 2 is an example analysis subsystem for acquiring holograms of samples in accordance with an embodiment of the present disclosure.

FIG. 2 is an example analysis subsystem 204 for acquiring holograms of samples in accordance with an embodiment of the present disclosure. Analysis subsystem 204, just one example of analysis subsystem 104, may be used to obtain holograms of a sample at different illumination energies. As noted, obtaining holograms at different illumination energy, structural and atomic information about the sample is determinable through comparison of the different holograms. The comparison may involve deconvolution, convolution, multiplication, division, addition, subtraction averaging, and combinations thereof. The structural and atomic information may at least include depth information of the components forming the sample, atomic identities and bonding information. The components forming the sample include atoms, molecules and/or other complexes that make up the sample.

Subsystem 204 at least includes an emitter 208 and a detector 210. A sample 212 may be located between the emitter 208 and the detector 210 for the formation of a hologram 220 on a surface of the detector. Such arrangement forms an in line holography system, but other arrangements are covered by the disclosure. Emitter 208 may be any type of emitter desired, such as a charged particle emitter (e.g., electrons or ions), or a photon-based emitter (e.g., laser). In some embodiments, emitter 208 is an electron emitter able to provide coherent electron beams having energies from 50 to 500 eV. When referring to the energy of the electron beam it should be understood that each electron forming the beam has the desired energy. Regardless of emitter type, an illumination wave front 214 propagates toward sample 212. When the wave front 214 reaches sample 212, elastic and inelastic interactions occur with the sample, e.g., with the components that form the sample, resulting in undiffracted wave 216 and diffracted wave 218 interacting at the detector 210 to form the hologram 220. Hologram 220 may also be referred to as an interference pattern.

In some embodiments, the emitter 208 may be adjusted to provide illumination beams of different energies. For example, emitter 208 may provide an electron beam of electrons of 50 eV, 75 eV, 100 eV, and so on up to any desired energy. However, the energy levels may be limited by the material type of the sample 212. For instance, biological materials, such as proteins, may limit the electron energy to 250 eV or less. With each illumination being at a different energy, the resulting hologram 220 may be different. The differences, however, may allow the determination of structural and/or atomic information of the sample. This is due, at least in part, to the energy dependence of inelastic and elastic scattering cross-sections of the atoms/molecules that form the sample 212. By acquiring a plurality of holograms 220, each at a different illumination energy, and comparing the plurality of holograms 220, the determination of the structural and atomic information may be teased out of the holograms, thus resulting in deeper/refined information of the sample 212.

Figure 3:
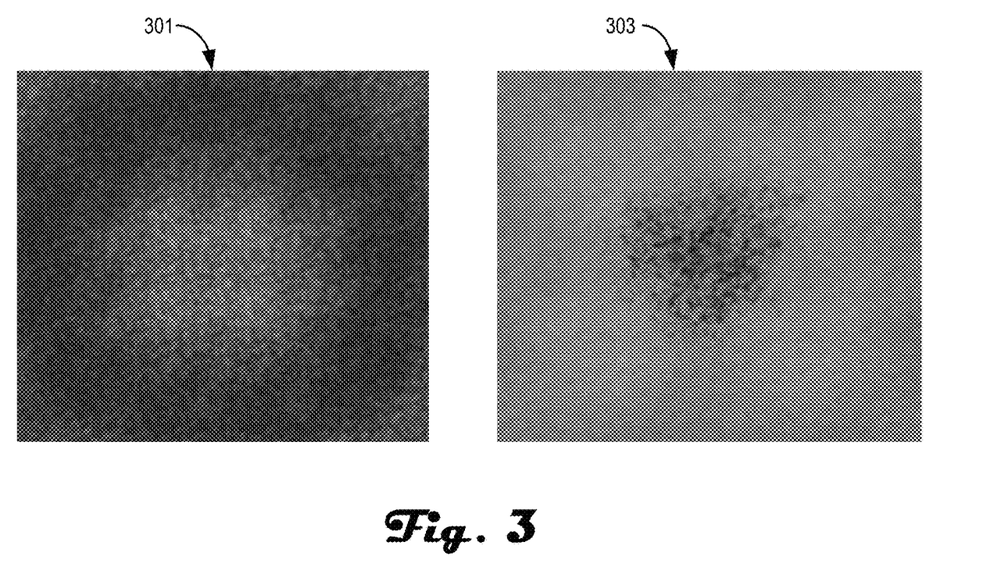
FIG. 3 includes example images.

FIG. 3 includes example images 301 and 303. Image 301 is an example hologram as acquired by a detector, such as the detector 210, and image 303 is an example reconstruction of the hologram in image 301. The image 301 may have been obtained using subsystem 204 and represents a hologram 220 of a protein-based sample. A controller (not shown) coupled to or included with subsystem 204 provided the reconstruction image 303 based on hologram 301. The controller, such as controller 107, generates the reconstruction using any known reconstruction technique. The dark areas in image 303 show the location of the components forming the imaged sample. Since this is a single hologram/reconstruction, limited information is provided by the hologram or reconstruction, such as relative two-dimensional information of the components forming the sample. However, such information may be improved on using the techniques disclosed herein, namely additional depth information (in the direction of the illumination beam) and atomic information may be obtained.

Figure 4:
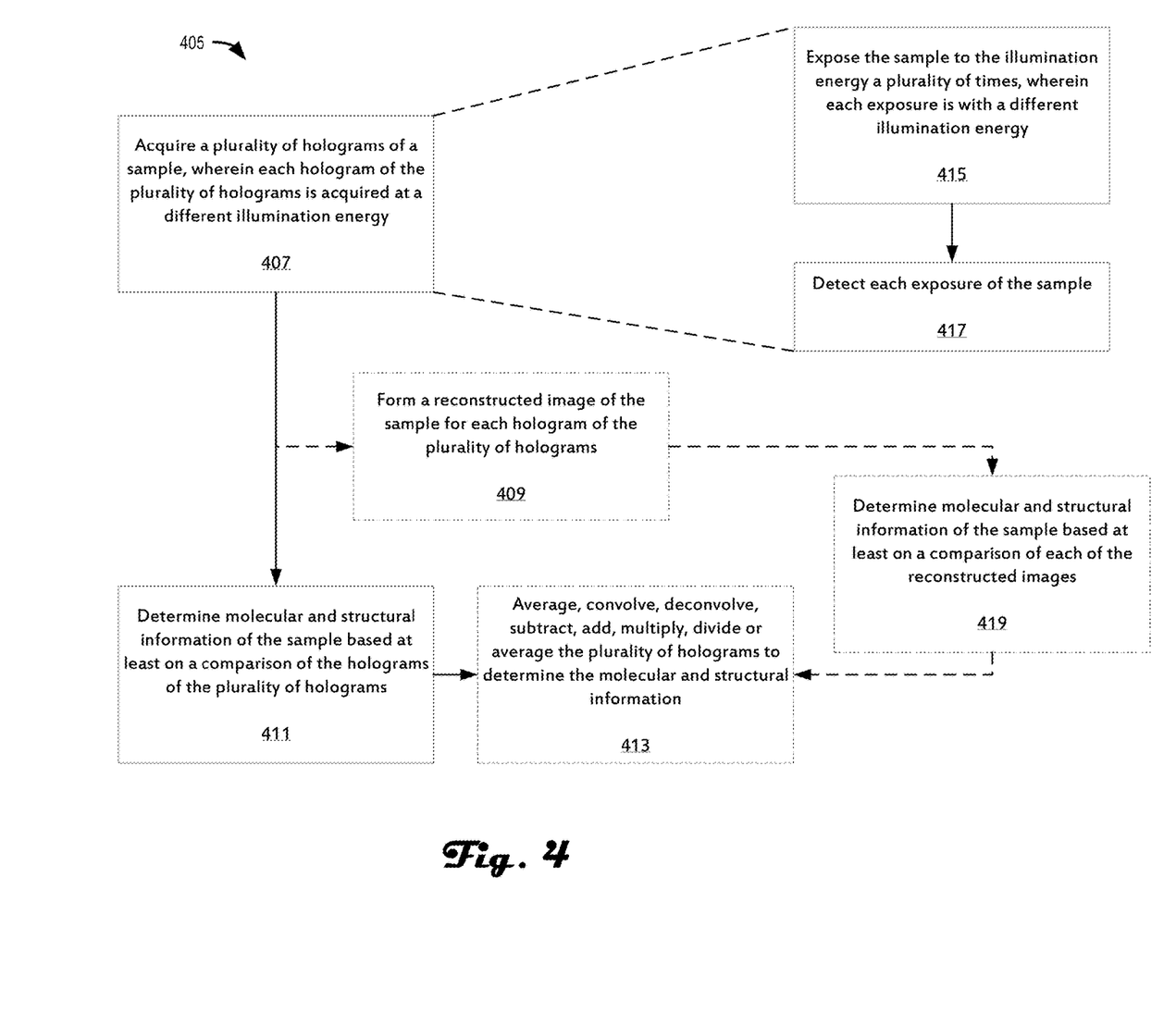
FIG. 4 is an example method for acquiring holograms and determining structural and atomic information of a sample in accordance with an embodiment of the present disclosure.

FIG. 4 is an example method 405 for acquiring holograms and determining structural and atomic information of a sample in accordance with an embodiment of the present disclosure. The method 405 may be performed by any direct imaging system. In some examples, a direct electron holography system, such as system 100, may be used to implement method 405.

The method 405 may begin at process block 407, which includes acquiring a plurality of holograms of a sample with each hologram being acquired using a different illumination energy. In some embodiments, the illumination is an electron beam that can be provided at varying energies, such as from 50 eV to 500 eV, or higher. In other embodiments, the illumination energy is a laser.

Process block 407 may be broken down into two separate processes, such as process blocks 415 and 417. Process block 415 includes exposing the sample to illumination energy a plurality of times where each exposure is with a different illumination energy. Process block 415 is followed by process 417, which includes detecting each exposure of the sample to acquire each hologram of the plurality of holograms.

Process block 407 may be followed by process block 411, which includes determining molecular and atomic information of the sample based at least on a comparison of the holograms of the plurality of holograms. The comparison may be performed using any known mathematical operations as indicated in process block 413, such as deconvolution, convolution, addition, subtraction, multiplication, division, averaging, and combinations thereof. The end result of the comparison may provide depth information of atoms or complexes that form the sample, the depth being in the direction of illumination propagation. Additionally or alternatively, the comparison may identify specific atoms forming the material due to their different elastic and inelastic scattering cross sections, and/or information about their bonding energies.

In some embodiments, process block 407 may optionally, alternatively or additionally, be followed by process block 409, which includes forming a reconstructed image of the sample for each hologram of the plurality of holograms. The reconstruction of each hologram may be performed using any known reconstruction algorithm, such as non-iterative reconstruction using the paraxial approximation, non-iterative reconstruction using a non-paraxial algorithm.

Process block 409 may be followed by process block 419, which includes determining molecular and atomic information of the sample based at least on a comparison of each of the reconstructed images. The comparison may be performed using any of or a combination of the operations shown in process block 413.

Figure 5:
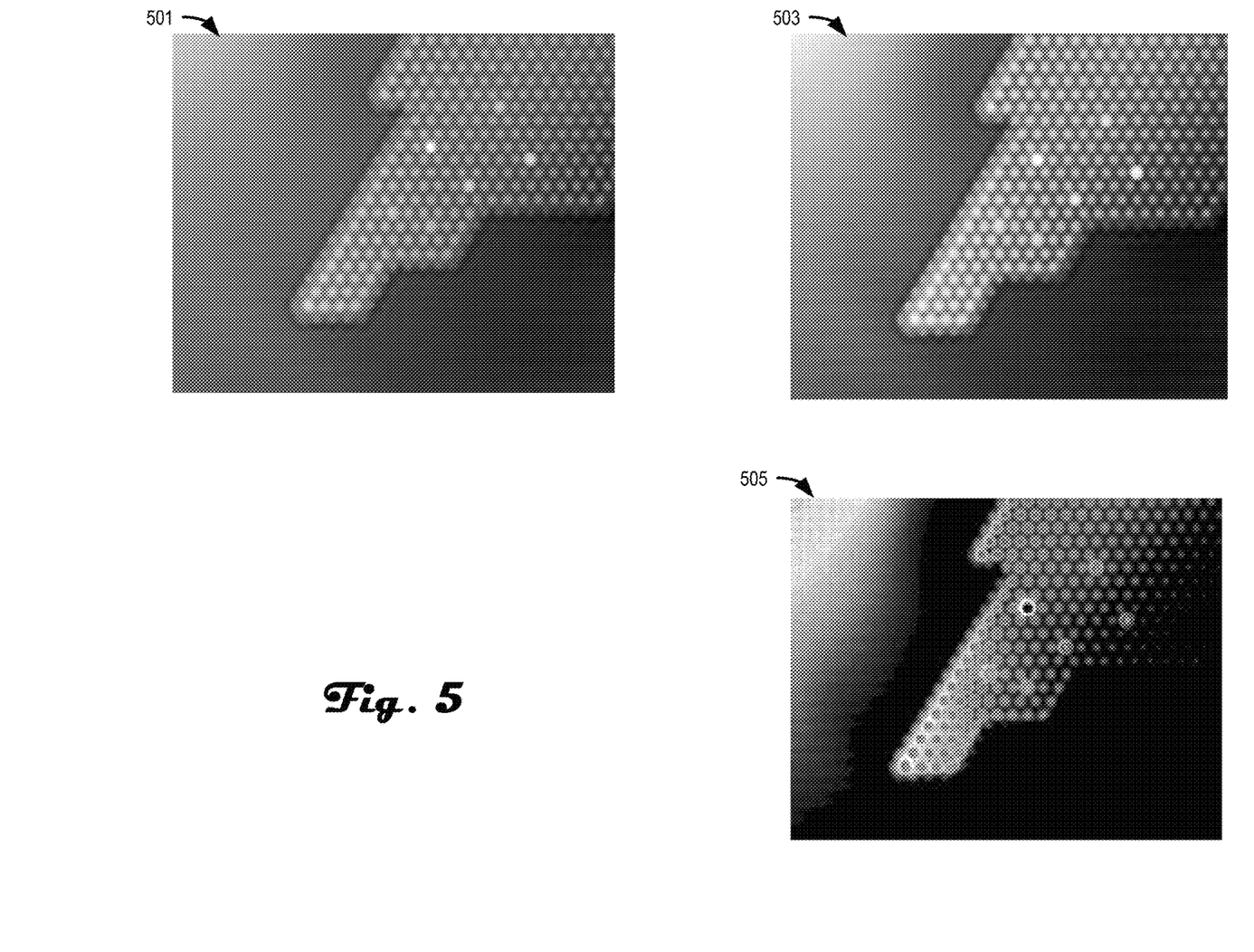
FIG. 5 is an example image sequence in accordance with an embodiment of the present disclosure.

FIG. 5 is an example image sequence in accordance with an embodiment of the present disclosure. The image sequence includes image 501, 503 and 404, that depicts a sequence of holograms that are subtracted to determine structural information of the sample. Image 501 is a first hologram acquired at a first energy, image 503 is a second hologram acquired at a second energy, and image 505 is a hologram based on subtraction of images 501 and 503. All images are of the same sample. as can be seen images 501 and 503 provide varying information of the sample and their difference, shown in image 505, provides additional detail not visible in either images 501 and 505. For example, each dot in image 505 shows a ring around a center feature, which is not seen in either of the other two images.

Figure 6:
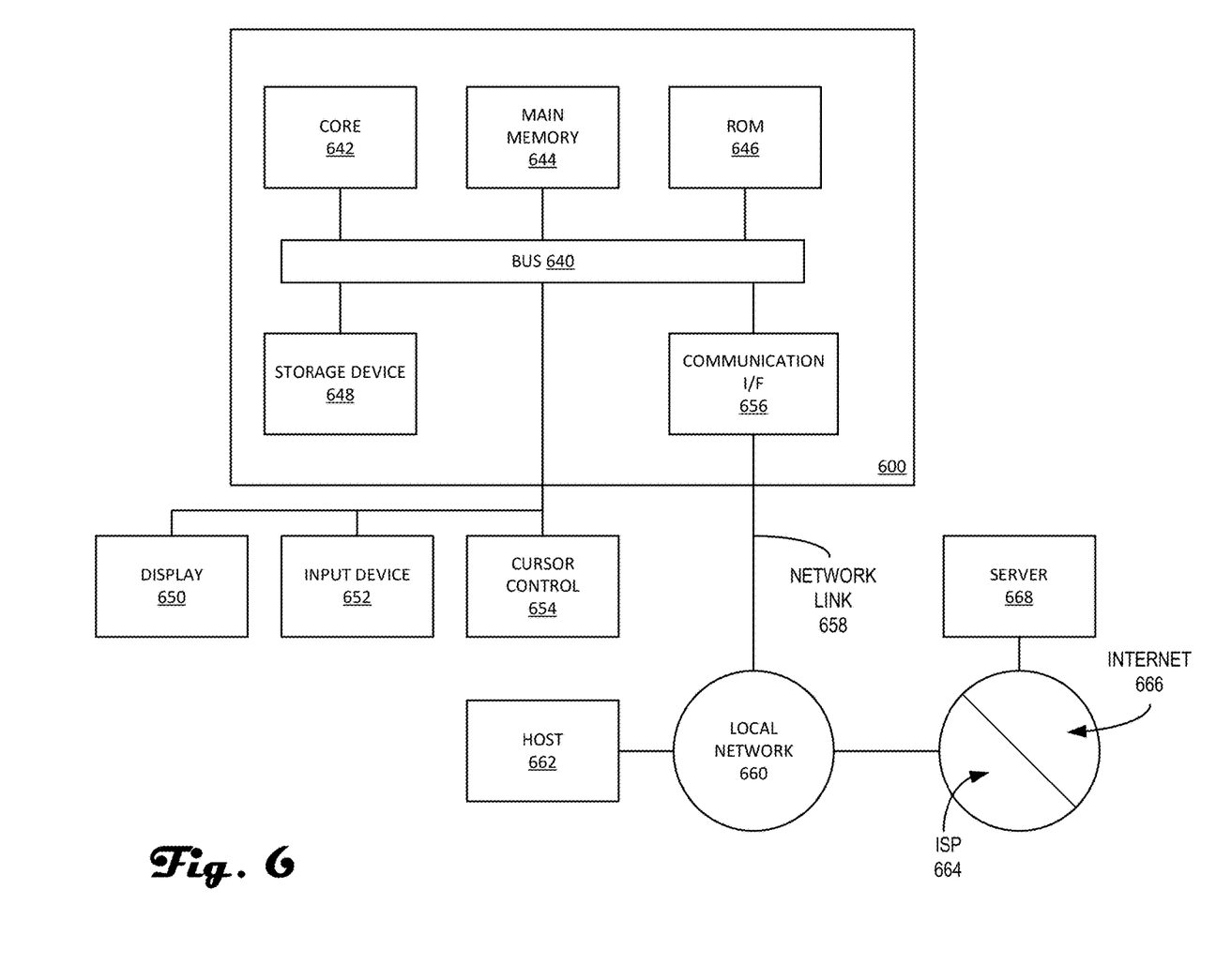
FIG. 6 is an example functional block diagram in accordance with an embodiment of the present disclosure.

FIG. 6 is an example functional block diagram 600 in accordance with an embodiment of the present disclosure. FIG. 6 is a block diagram that illustrates a computer system 600 that an embodiment of the invention may include. The computing system 600 may be an example of computing hardware included with system 100, such controller 107, subsystems 102, 104, 106, and/or coupled servers (not shown). Computer system 600 at least includes a bus 640 or other communication mechanism for communicating information, and a hardware processor 642 coupled with bus 640 for processing information. Hardware processor 642 may be, for example, a general purpose microprocessor. The computing system 600 may be used to implement the methods and techniques disclosed herein, such as methods 301 and 401, and may also be used to obtain images and segment said images with one or more classes.

Computer system 600 also includes a main memory 644, such as a random access memory (RAM) or other dynamic storage device, coupled to bus 640 for storing information and instructions to be executed by processor 642. Main memory 644 also may be used for storing temporary variables or other intermediate information during execution of instructions to be executed by processor 642. Such instructions, when stored in non-transitory storage media accessible to processor 642, render computer system 600 into a special-purpose machine that is customized to perform the operations specified in the instructions.

Computer system 600 further includes a read only memory (ROM) 646 or other static storage device coupled to bus 640 for storing static information and instructions for processor 642. A storage device 648, such as a magnetic disk or optical disk, is provided and coupled to bus 640 for storing information and instructions.

Computer system 600 may be coupled via bus 640 to a display 650, such as a cathode ray tube (CRT), for displaying information to a computer user. An input device 652, including alphanumeric and other keys, is coupled to bus 640 for communicating information and command selections to processor 642. Another type of user input device is cursor control 654, such as a mouse, a trackball, or cursor direction keys for communicating direction information and command selections to processor 642 and for controlling cursor movement on display 650. This input device typically has two degrees of freedom in two axes, a first axis (e.g., x) and a second axis (e.g., y), that allows the device to specify positions in a plane.

Computer system 600 may implement the techniques described herein using customized hard-wired logic, one or more ASICs or FPGAs, firmware and/or program logic which in combination with the computer system causes or programs computer system 600 to be a special-purpose machine. According to one embodiment, the techniques herein are performed by computer system 600 in response to processor 642 executing one or more sequences of one or more instructions contained in main memory 644. Such instructions may be read into main memory 644 from another storage medium, such as storage device 648. Execution of the sequences of instructions contained in main memory 644 causes processor 642 to perform the process steps described herein. In alternative embodiments, hardwired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 648. Volatile media includes dynamic memory, such as main memory 644. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including the wires that comprise bus 640. Transmission media can also take the form of acoustic or light waves, such as those generated during radio-wave and infra-red data communications.

Various forms of media may be involved in carrying one or more sequences of one or more instructions to processor 642 for execution. For example, the instructions may initially be carried on a magnetic disk or solid state drive of a remote computer. The remote computer can load the instructions into its dynamic memory and send the instructions over a telephone line using a modem. A modem local to computer system 600 can receive the data on the telephone line and use an infra-red transmitter to convert the data to an infra-red signal. An infra-red detector can receive the data carried in the infra-red signal and appropriate circuitry can place the data on bus 640. Bus 640 carries the data to main memory 644, from which processor 642 retrieves and executes the instructions. The instructions received by main memory 644 may optionally be stored on storage device 648 either before or after execution by processor 642.

Computer system 600 also includes a communication interface 656 coupled to bus 640. Communication interface 656 provides a two-way data communication coupling to a network link 658 that is connected to a local network 660. For example, communication interface 656 may be an integrated services digital network (ISDN) card, cable modem, satellite modem, or a modem to provide a data communication connection to a corresponding type of telephone line. As another example, communication interface 656 may be a local area network (LAN) card to provide a data communication connection to a compatible LAN. Wireless links may also be implemented. In any such implementation, communication interface 656 sends and receives electrical, electromagnetic or optical signals that carry digital data streams representing various types of information.

Network link 658 typically provides data communication through one or more networks to other data devices. For example, network link 658 may provide a connection through local network 660 to a host computer 662 or to data equipment operated by an Internet Service Provider (ISP) 664. ISP 664 in turn provides data communication services through the world wide packet data communication network now commonly referred to as the "Internet" 666. Local network 660 and Internet 666 both use electrical, electromagnetic or optical signals that carry digital data streams. The signals through the various networks and the signals on network link 658 and through communication interface 656, which carry the digital data to and from computer system 600, are example forms of transmission media.

Computer system 600 can send messages and receive data, including program code, through the network(s), network link 658 and communication interface 656. In the Internet example, a server 668 might transmit a requested code for an application program through Internet 666, ISP 664, local network 660 and communication interface 656.

The received code may be executed by processor 642 as it is received, and/or stored in storage device 648, or other non-volatile storage for later execution.

The embodiments discussed herein to illustrate the disclosed techniques should not be considered limiting and only provide examples of implementation. Those skilled in the art will understand the other myriad ways of how the disclosed techniques may be implemented, which are contemplated herein and are within the bounds of the disclosure.

What is claimed is:

1. A method comprising:
    acquiring, with an electron beam, a plurality of holograms of a sample, wherein each hologram of the plurality of holograms is acquired at a different electron beam energy; and
    determining atomic and structural information of the sample based at least on a comparison of at least two of the holograms of the plurality of holograms, wherein the atomic information provides information about the atoms forming the sample and bonding information.

2. The method of claim 1, wherein the structural information includes depth information for components of the sample, the depth information in a direction of the electron beam path.

3. The method of claim 2, wherein the components of the sample includes atoms and complexes that form the sample.

4. The method of claim 1, further including forming a reconstructed image of the sample for each hologram of the plurality of holograms to obtain a plurality of reconstructed images.

5. The method of claim 4, further including determining atomic and structural information of the sample based at least on a comparison of two of the reconstructed images of the plurality of reconstructed images.

6. The method of claim 5, wherein the atomic information provides information about the atoms forming the sample and bonding information.

7. The method of claim 5, wherein the structural information includes depth information for components of the sample, the depth information in a direction of the electron beam path.

8. The method of claim 1, further including adjusting an electron emitter between acquiring each hologram of the plurality of holograms to change the energy of the electron beam.

9. The method of claim 1, wherein acquiring a plurality of holograms of a sample at least comprises:
    exposing the sample to the electron beam a plurality of times, wherein an energy of the electron beam is different for each acquisition of a hologram of the plurality of holograms; and
    detecting, by a detector, an interference pattern in response to each exposure.

10. The method of claim 9, wherein the energy of the electron beam varies from 50 eV to 250 eV.

11. The method of claim 9, wherein the detector is either a direct electron detector or a micro-channel plate detector.

12. The method of claim 1, wherein determining atomic and structural information of the sample based at least on a comparison of the holograms of the plurality of holograms comprises:
averaging, convolving, deconvolving, subtracting, adding, multiplying, dividing, or combinations thereof the plurality of holograms to determine the atomic and structural information.

13. An apparatus comprising:
an emitter coupled to emit an electron beam toward a sample;
a detector coupled to receive the electron beam after interacting with the sample; and
a controller coupled to the emitter and detector, the controller including code that, when executed, causes the controller to:
acquire, with an electron beam, a plurality of holograms of a sample, wherein each hologram of the plurality of holograms is acquired at a different electron beam energy; and
determine atomic and structural information of the sample based at least on a comparison of at least two of the holograms of the plurality of holograms, wherein the atomic information provides information about the atoms forming the sample and bonding information.

14. The apparatus of claim 13, wherein the structural information includes depth information for components of the sample, the depth information in a direction of the electron beam path.

15. The apparatus of claim 13, wherein the code to determine atomic and structural information of the sample based at least on a comparison of the holograms of the plurality of holograms further comprises code that, when executed by the controller, causes the controller to:
average, convolve, deconvolve, subtract, add, multiply, divide, or combinations thereof the at least two holograms of the plurality of holograms to determine the atomic and structural information.

16. The apparatus of claim 13, further including code that, when executed by the controller, causes the controller to:
form a reconstructed image of the sample for each hologram of the plurality of holograms to obtain a plurality of reconstructed images.

17. The apparatus of claim 16, further including code that, when executed by the controller, causes the controller to:
determine atomic and structural information of the sample based at least on a comparison of two of the reconstructed images of the plurality of reconstructed images.

18. The apparatus of claim 13, further including code that, when executed by the controller, causes the controller to:
expose the sample to the electron beam a plurality of times, wherein an energy of the electron beam is different for each acquisition of a hologram of the plurality of holograms; and
detect an interference pattern in response to each exposure.

* * * * *